United States Patent [19]
Bethea et al.

[11] Patent Number: 4,599,632
[45] Date of Patent: Jul. 8, 1986

[54] PHOTODETECTOR WITH GRADED BANDGAP REGION

[75] Inventors: Clyde G. Bethea, Plainfield; Federico Capasso, Westfield; Albert L. Hutchinson, Piscataway; Barry F. Levine, Livingston; Won-Tien Tsang, New Providence, all of N.J.

[73] Assignee: AT&T Bell Laboratories, Murray Hill, N.J.

[21] Appl. No.: 412,786

[22] Filed: Aug. 30, 1982

[51] Int. Cl.$^4$ ............................................. H01L 27/14
[52] U.S. Cl. ..................................... 357/30; 357/16; 357/90
[58] Field of Search .............................. 357/16, 30, 90

[56] References Cited

U.S. PATENT DOCUMENTS

| 4,203,124 | 5/1980 | Gordon et al. | 357/16 |
| 4,254,429 | 3/1981 | Yamazaki | 357/16 |
| 4,383,269 | 5/1983 | Capasso | 357/90 X |

OTHER PUBLICATIONS

G. F. Williams et al, "The Graded Bandgap Multilayer Avalanche Photodiode: A New Low-Noise Detector," *IEEE Electron Device Letters*, vol. EDL-3, No. 3, Mar. 1982, pp. 71–73.

D. H. Auston et al, "Picosecond Optoelectronic Detection, Sampling, and Correlation Measurements in Amorphous Semiconductors," *Applied Physics Letters*, vol. 37, No. 4, Aug. 15, 1980, pp. 371–373.

J. M. Woodall et al, "An Isothermal Etchback-Regrowth Method for High-Efficiency $Ga_{1-x}Al_x$-As-GaAs Solar Cells," *Applied Physics Letters*, vol. 30, No. 9, May 1, 1977, pp. 492–493.

H. Kroemer, "Quasi-Electric and Quasi-Magnetic Fields in Nonuniform Semiconductors," *RCA Review*, Sep. 1957, pp. 332–342.

Primary Examiner—Andrew J. James
Assistant Examiner—William A. Mintel
Attorney, Agent, or Firm—Richard D. Laumann

[57] ABSTRACT

A photodetector having a graded bandgap region is an ultrahigh speed photodetector when operated at zero bias.

10 Claims, 3 Drawing Figures

PHOTODETECTOR WITH GRADED BANDGAP REGION

TECHNICAL FIELD

This invention relates generally to photodetectors and particularly to photodetectors having graded bandgap regions.

BACKGROUND OF THE INVENTION

Devices capable of detecting electromagnetic radiation, commonly referred to as photodetectors, have many applications in modern technology. These devices typically produce an electrical signal in response to the radiation and are used in such diverse applications as solar cells, infrared sensors, and photodetectors in optical communications systems. The latter application has become increasingly important with the development of low loss silica-based optical fibers. In the optical communications systems presently contemplated, such fibers optically couple light sources ansd photodetectors.

As the desired data rates for such optical communications systems increase, as well as for other applications, there has been an increase in demand for still faster photodetectors. Several photodetectors have been developed that are capable of detecting approximately picosecond pulses. For example, *Applied Physics Letters*, 37, pp. 371-373, Aug. 15, 1980, discloses a high speed photodetector using an amorphous semiconductor such as, for example, silicon.

Various approaches, for example, new structures or compositions, have been tried in attempts to improve photodetector performance. With the development of new crystal growth techniques, such as molecular beam epitaxy (MBE), that permit precise compositional control and variation, additional possibilities for improving photodetector performance by exploiting these approaches have opened. For example, it is now possible to grow semiconductor materials that have both compositional and bandgap variations in the growth direction. It is also possible to grow semiconductor structures that have abrupt composition, including doping, variations. Several photodetectors have been developed that use the capability that MBE has of growing such materials and structures. For example, it has been found that the ratio of the ionization coefficients of electrons to holes can be substantially altered in Group III-V compound semiconductors by compositionally grading the semiconductor. The asymmetry of the ionization energies and the quasi-electric fields that the electrons and holes see is produced by the strong bandgap grading that results from the compositional grading. Another device using compositional variation is the multistage graded bandgap avalanche photodetector, commonly referred to as a "staircase APD", which might be viewed as the solid state analog of a photomultiplier. See, *Electron Device Letters*, EDL-3, pp. 71-73, March 1982. Graded bandgap materials have been used in other opto-electronic devices, such as solar cells, that were fabricated by other crystal growth techniques such as liquid phase epitaxy (LPE). See, for example, *Applied Physics Letters*, 30, pp. 492-493, May 1, 1977. The device disclosed had a graded bandgap p-type $Ga_{1-x}Al_xAs$ layer.

The preceding discussion should not give the impression that the use of graded bandgap materials is limited to opto-electronic devices as the use of graded bandgap materials in devices other than photodetectors has long been known. For example, Kroemer proposed in *RCA Review*, 18, pp. 332-342, September 1957, the use of a graded bandgap base region in a transistor. The effect of the graded bandgap base region is to produce a quasi-electric field which reduces the base transit time which is otherwise normally diffusion limited.

SUMMARY OF THE INVENTION

We have found that a device comprising a first semiconductor region having a first conductivity type and a first bandgap, a second semiconductor region having a second conductivity type, a third semiconductor region having a first conductivity type and a second bandgap, and a photosensitive region, is a high speed photodetector. The first bandgap is less than or equal to the second bandgap and the second region has a bandgap that is graded from a first greater value adjacent to the third region to a second lesser value adjacent to the first region. The second bandgap should be greater than the first greater value. For a device operated at zero bias, the first bandgap should be less than the second lesser value. The device also comprises means for electrically contacting the first and third semiconductor regions. In a preferred embodiment, the photosensitive region, that is, the region where protons are absorbed and electron-hole pair is produced, is in at least one of the second or first regions. In a further preferred embodiment, the photodetector comprises Group III-V semiconductor compounds. In a still further preferred embodiment, the first and second conductivity types are n and p, respectively, as device response times are faster because of the higher electron mobility.

DETAILED DESCRIPTION

Figure 1:
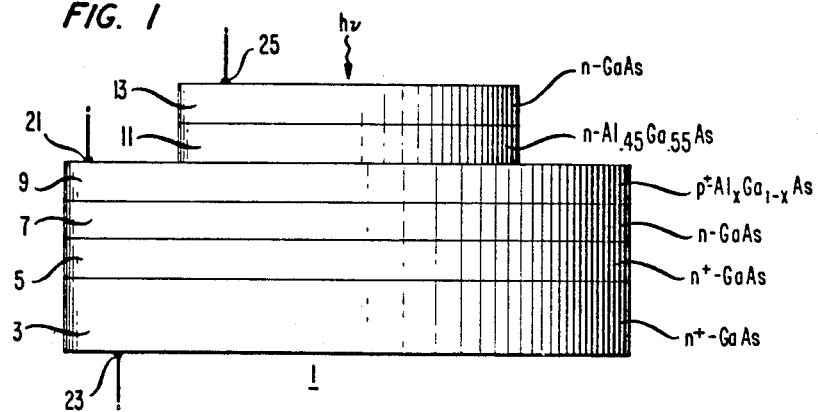
FIG. 1 is a end view of one embodiment of a device according to our invention.

An exemplary embodiment of a photodetector according to our invention is shown in end in FIG. 1. For reasons of clarity, the elements of the device are not drawn to scale. The device, indicated generally as 1, comprises substrate 3 having a first conductivity type, a buffer layer 5 having a first conductivity type, a first semiconductor region 7 having a first conductivity type and a first bandgap, a second semiconductor region 9 having a second conductivity type, a third semiconductor region 11 having a first conductivity type and a second bandgap and contact region 13. Region 11 has a bandgap that is greater than or equal to the bandgap of region 7. The bandgap of region 9 is graded from a first greater value adjacent to the third region to a second lesser value adjacent to the first region. The first bandgap may be less than the second bandgap. The first bandgap should also be less than the leser value if the device is operated at zero bias. Light, indicated as hv, is incident on the device as shown. Layers 11 and 13 act as window layers and the light is absorbed, producing electron-hole pairs, in a photosensitive region in the second or first regions. The window layers should be thin to reduce absorption of light in these layers. If the layer is too thick as grown, selected portions may be removed to reduce absorption in these layers. The device also comprises means for electrically contacting the first and third semiconductor regions which in the embodiment depicted comprise the substrate and buffer layer for the first region and contact region 13 for the third region and contacts 23 and 25, respectively. Region 9 may be electrically contacted with contact 21. The device may be fabricated as a wide gap first region with the first bandgap being greater than the second lesser value.

The substrate and buffer regions are desirably heavily doped, that is, greater than $10^{17}/cm^3$, as is region 13 to facilitate formation of ohmic contacts. The buffer layer is grown as it facilitates growth of the collector region. The first and third region doping concentrations are desirably kept low, that is, less than $5 \times 10^{16}/cm^3$, to minimize both first region, second region, and third region-second region capacitances. In a preferred embodiment, the device comprises Group III-V compound semiconductors. In a further preferred embodiment, the Group III-V compound semiconductor comprises $Al_xGa_{1-x}As$, x greater than or equal to 0.0 and less than or equal to 1.0, and the first and second conductivity types are n and p, respectively. In a particular embodiment, the substrate comprises a n+ Si-doped, with a concentration of $4 \times 10^{18}/cm^3$, GaAs substrate. The buffer region comprised n+ GaAs. The first region was Sn-doped with a doping concentration of approximately $10^{15}/cm^3$ and 1.5 μm thick. The second region was 0.4 μm thick and was compositionally graded from GaAs adjacent to the first region to $Al_{0.2}Ga_{0.8}As$ adjacent to the third region. The second region was heavily doped with Be with a concentration of $5 \times 10^{18}/cm^3$. The wide bandgap third region comprised $Al_{0.45}Ga_{0.55}As$ and was 1.5 μm thick and n-type doped with Sn with a concentration of $2 \times 10^{15}/cm^{+3}$. The contact region was approximately 1000 Angstroms thick and comprised GaAs heavily doped with Sn with a concentration of $5 \times 10^{18}/cm^3$.

The device is conveniently fabricated by molecular beam epitaxy as this technique permits the required compositional grading to be expediently accomplished. This growth technique is well known and its details need not be described. The compositional variation may be achieved by, for example, varying the temperature of one of the effusion ovens. After growth, the devices were mesa processed using standard photolithographic and etching techniques that are well known to those working in the art. The ohmic contacts were fabricated by evaporating Au-Su-Au and alloying at a temperature of approximately 520 degrees C. for several seconds in a hydrogen flow and subsequently dc plating with Au. Contact 21 is conveniently formed with known semiconductor processing technology. For example, photolithography and a selective etch could be used to remove portions of regions 11 and 13. Material for contact 21 could then be deposited on region 9. It will be readily appreciated by those working in the art that the structure depicted in FIG. 1 is an idealized depiction of a device. The devices fabricated typically had an area between $5 \times 10^{-5}$ and $10^{-4}/cm^2$ although devices may be usefully made with both greater and lesser areas.

Figure 2:
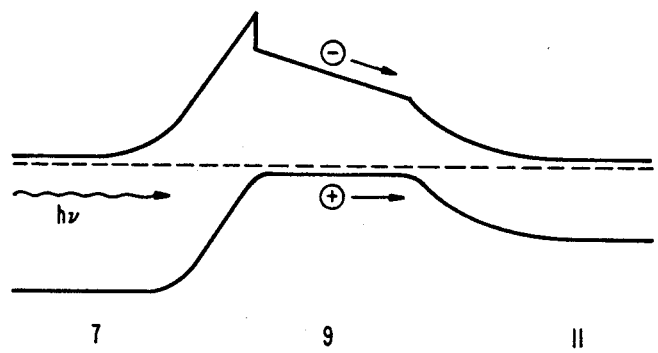
FIG. 2 is an energy band diagram which illustrates the detection process of our photodetector at zero bias.

FIG. 2 shows the energy band diagram and photodetection process at zero bias in a device such as that depicted in FIG. 1. For reasons of clarity, only the first, second and third regions are shown. The incident light is shown as hv and the electron and hole produced by absorption are shown as + and −, respectively. The dotted line represents the Fermi level. Most of the incident radiation should be absorbed in the photosensitive region in the graded bandgap second semiconductor region. This is accomplished by selecting a material for the base having an absorption length $1/\alpha$ at the wavelength of the radiation of interest which is smaller than the second region width. Under the action of the quasi-electric field produced by the bandgap grading, the electron-hole pairs, which were generated by the absorption of the incident photons, drift toward the first region with an ambipolar group drift velocity. The carriers reach the edge of the second region-first region junction in a time which is comparable to the incident pulse duration. At the second region-first region junction, p+-n electrons are injected into the first region while the holes are stopped by the built-in electric potential at the junction as shown on FIG. 2. The holes thus accumulate and time dependent photovoltage develops at the unbiased p-n junction which is divided between the junction, the second and third region, and an external load resistor. As a consequence, photo-electrons flow from the first region to the third region via the external circuit until the electron quasi-fermi levels on both sides of the second region are approximately equal and both the capacitances of both junctions are charged. Thus, both the third-section region and first-second region barriers are reduced. The charging process occurs relatively rapidly and, for the embodiment depicted in FIG. 1, is of the order of the rc time constant, that is, approximately 15 ps. Subsequent return of the device to its equilibrium configuration occurs primarily via thermionic emission processes of holes over the reduced second-third region and second-first region barriers followed by recombination with electrons in both the first and third region or at the contact regions. These processes effectively discharge the two capacitances and are relatively rapid because of the large second region-third region and second region-first region barrier lowering caused by relatively high incident power levels. Lower incident power levels may lead to slower returns to equilibrium configurations.

Figure 3:
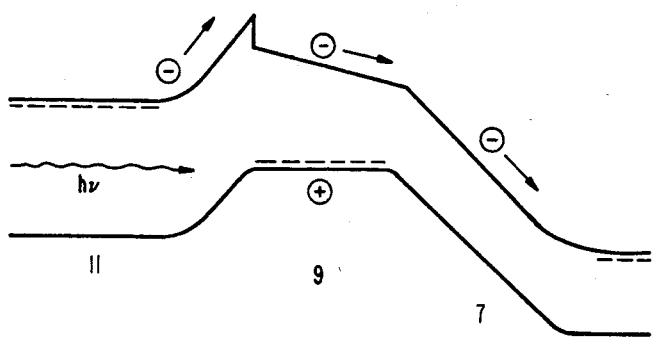
FIG. 3 is an energy band diagram of the graded bandgap phototransistor under bias.

If the second region-first region junction is reverse biased, the device behaves as a phototransistor with the second region-first region diode acting as a current source which is amplified by transistor action via lowering of the second region-first region potential. This energy band configuration is depicted in FIG. 3. A large increase in sensitivity was observed. The first, second and third regions mat be referred to as the collector, base and emitter regions, respectively. The effective charging time $(KT/I_e)(C_{be}+C_{bc})$, where $I_e$ is the emitter current and $C_{be}$ and $C_{bc}$ are the base-emitter and base-collector capacitances, respectively, is negligible at high power levels and response time is comparable to that observed at zero bias.

The ultrahigh speed, that is, picosecond, response of our device is related to the graded bandgap region. Most of the incident light is absorbed in this heavily doped region. If there is no quasi-electric field in the heavily doped region, broadening of the device response might be expected due to the slow diffusion processes. The diffusion time, $t_D$, is $w^2/D$, where w is the base thickness and D is the diffusion coefficient. For a device having a GaAs p+-type second region with a doping concentration of $10^{18}/cm^3$, D is approximately 20 cm$^2$/sec. In the embodiment discussed, D is likely to be somewhat smaller because of the AlGaAs graded second region which has a lower mobility than does a comparable GaAs region and the higher doping concentration. Thus, for the structure discussed, $t_D$ should be greater than or approximately equal to 100 psec. The fact that no pulse broadening is observed indicates that the quasi-electric field in the base region sweeps out the electrons at a time which is small as compared with the diffusion time. It should be noted that contacting the base will improve the response time at low power levels. Such a contact will reduce the base-emitter capacitance charging time.

Pulse response measurements were made by mounting the photodetector with conductive epoxy on one arm of a 50 ohm strip line. This arm was connected to the dc power supply. A Au wire was then thermal compression bonded to the emitter contact and connected to the other arm of the strip line which was connected to the sampling oscilloscope. A mode locked 6200 Angstrom dye laser emitting 5 psec pulses was used as the light source. The laser had a repetition rate of 82 MHz. The pulse response is strongly affected by the bias condition. At zero bias, the device shows an ultrahigh response speed. At zero bias, the rise and fall times are symmetric and there is no long tail. Intrinsic detector response time was estimated to be 20 psec. The peak incident laser power was in the 0.1 to 1.0 Watt range.

When the base-collector junction is reverse biased, the device operates as a phototransistor. The rise time and the full width at half maximum (FWHM) are comparable to the observed response time at zero bias but the sensitivity is much higher. However, after the fast decay of the pulse, a long tail, with a time constant of several hundredths of psec, was clearly observable. The pulse response of the phototransistor was examined at incident optical powers between 10 mW and 10 Watts. The rise time and the FWHM did not vary with incident power levels but it was clearly observed that the magnitude of the tail become smaller as the incident optical power level decreased. Contacting the base region and forward biasing the base-emitter junction will improve device response time at low power levels.

Other embodiments are contemplated. For example, although a mesa embodiment has been described, a planar embodiment is also contemplated. Furthermore, although an embodiment has been described in which the bandgap of the graded region increases with the distance from the substrate, embodiments are contemplated in which the light is incident through the substrate and the bandgap of the graded region decreases with increasing distance from the substrate.

What is claimed is:

1. A photodetector comprising a first semiconductor region having a first conductivity type and a first bandgap; a second semiconductor region having a second conductivity type; and a third semiconductor region having a first conductivity type and a second bandgap; said second region contacting said first and said third regions, said first bandgap being less than or equal to said second bandgap, said second region having a bandgap graded from a first value adjacent to said third region to a second value adjacent to said first region, said first value being greater than said second value; at least one of said second and first regions being radiation sensitive, and electrical contacts to said first and said third regions.

2. A device as recited in claim 1 in which said first bandgap is less than said second bandgap.

3. A device as recited in claim 2 further comprising an electrical contact to said second region.

4. A device as recited in claim 2 or 3 in which said first, second and third regions comprise Group III-V compound semiconductors.

5. A device as recited in claim 4 in which said Group III-V compound semiconductor comprises $Al_xGa_{1-x}As$, x greater than or equal to 0.0 and less than or equal to 1.0.

6. A device as recited in claim 5 in which said first conductivity type is n-type.

7. A device as recited in claim 2 or 3 in which said first bandgap is less than said second value.

8. A device as recited in claim 3 in which said second region-first region junction is reverse biased.

9. A device as recited in claim 8 in which said first conductivity type is n-type.

10. A device as recited in claim 9 in which said first bandgap is less than said second value.

* * * * *